United States Patent
Ridgers et al.

(10) Patent No.: US 8,249,535 B2
(45) Date of Patent: Aug. 21, 2012

(54) RADIO RECEIVERS

(75) Inventors: Timothy J. Ridgers, Bayeux (FR); Yann Le Guillou, Caen (FR); Fernand Courtois, Saint-Contest (FR)

(73) Assignee: NXP B.V., Eindhoven (NL)

( * ) Notice: Subject to any disclaimer, the term of this patent is extended or adjusted under 35 U.S.C. 154(b) by 281 days.

(21) Appl. No.: 12/863,774

(22) PCT Filed: Jan. 20, 2009

(86) PCT No.: PCT/IB2009/050197
§ 371 (c)(1),
(2), (4) Date: Jul. 21, 2010

(87) PCT Pub. No.: WO2009/093172
PCT Pub. Date: Jul. 30, 2009

(65) Prior Publication Data
US 2010/0291891 A1 Nov. 18, 2010

(30) Foreign Application Priority Data
Jan. 25, 2008 (EP) .................... 08100940

(51) Int. Cl.
*H04B 1/06* (2006.01)
*H04B 1/16* (2006.01)

(52) U.S. Cl. ........ 455/230; 455/216; 455/323; 455/334; 375/322

(58) Field of Classification Search .................. 455/205, 455/216, 226.1, 226.2, 230, 255, 260, 313, 455/318, 323, 334; 375/322, 324, 327
See application file for complete search history.

(56) References Cited

U.S. PATENT DOCUMENTS

| | | | |
|---|---|---|---|
| 4,543,542 A * | 9/1985 | Owen | 332/128 |
| 4,870,384 A * | 9/1989 | Thomas | 332/123 |
| 6,278,750 B1 | 8/2001 | Yu | |
| 6,680,680 B1 | 1/2004 | Mellot | |

(Continued)

FOREIGN PATENT DOCUMENTS

JP 2006-121160 A 5/2006

(Continued)

OTHER PUBLICATIONS

Mostafa, M., et al. "WCDMA Receiver Architecture with Unique Frequency Plan," Proc. 14th Annual IEEE Int'l. ASIC/SOC Conf., pp. 57-61 (2001).
Written Opinion for Int'l. Patent Appln. No. PCT/IB2009/050197.

(Continued)

*Primary Examiner* — Quochien B Vuong

(57) ABSTRACT

A radio receiver comprises an input (14) for a modulated radio frequency signal, a frequency down converter (16) coupled to the input, the frequency down converter including quadrature mixers (32,34) for demodulating a received modulated radio frequency signal using a local oscillator signal. An analogue-to-digital converter (54, 56) is coupled to receive demodulated signals from the mixing means. The analogue-to-digital converter, which may comprise a continuous time sigma delta converter, has an input for a sampling clock frequency (f s). A voltage controlled oscillator (38) provides the local oscillator signal and supplies a frequency divider (60, 94) used to provide the sampling clock frequency. The dividing ratio (1/A) of the frequency divider is variable in response to variations in the strength of an 15 output signal from the digital-to-frequency converter and the variations in the frequency of the sampling clock frequency vary the gain of the analogue-to-frequency converter thereby providing automatic gain control.

10 Claims, 2 Drawing Sheets

U.S. PATENT DOCUMENTS

Figure 1:
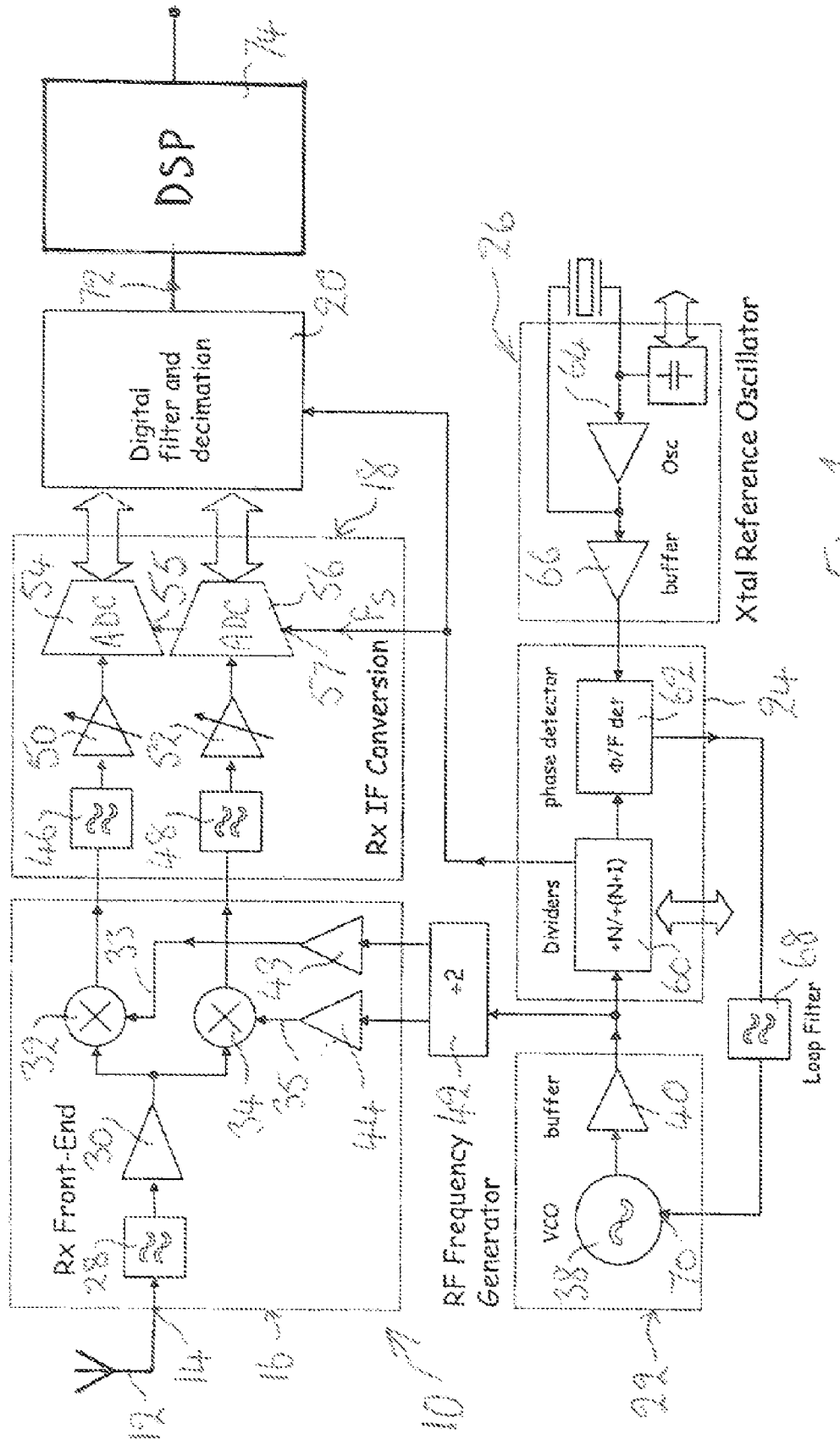

| | | | |
|---|---|---|---|
| 7,928,873 B1 * | 4/2011 | Huang | 341/122 |
| 8,145,171 B2 * | 3/2012 | Lin et al. | 455/260 |
| 2003/0067404 A1 | 4/2003 | Ruha et al. | |
| 2004/0229574 A1 | 11/2004 | Pfann et al. | |

FOREIGN PATENT DOCUMENTS

| | | |
|---|---|---|
| WO | 99/30428 A1 | 6/1999 |
| WO | 00/24167 A1 | 4/2000 |
| WO | 2005/055448 A1 | 6/2005 |

* cited by examiner

RADIO RECEIVERS

The present invention relates to improvements in or relating to radio receivers, particularly but not exclusively to multimode radio receivers Radio receivers for cellular and connectivity applications need to be able to operate across multiple frequency bands. The different variants of 2G, 2½ and 3G, plus 802.11 WLAN function in 7+ frequency bands. Future RF circuits will need to be able to operate not only across such bands, but also according to different modes. Already within the United States of America PCS band co-exist many systems, corresponding to specific signal modulations, channel spacing, signal bandwidths and so forth. This is also the case for 5.8 GHz and where 802.11 WLAN and UWB (Ultra-wideband) co-exist).

US 2004/0229574 A1 discloses an integrated transceiver whose receiver architecture comprises an input amplifier having an input coupled to an antenna by way of a duplexer. An output of the input amplifier is coupled to quadrature related signal paths, each of the quadrature related paths comprises a mixer which receives a local oscillator signal, a low pass filter, an analogue-to-digital converter (ADC) and a digital signal processor (DSP) for producing digital signal components of the received signal. The local oscillator signal and the sampling signal for the ADC are derived from a stable frequency source comprising a crystal controlled oscillator coupled to a frequency synthesiser formed by a voltage controlled oscillator (VCO) and a phase locked loop. A first divider derives quadrature related versions of a local oscillator signal and a second divider derives the clock frequency $f_s$ of the ADC sampling signal. The described arrangement can produce different clock frequencies without interference from harmonic frequencies produced by the various clock frequencies.

In operation it is often useful to implement a few simple gain steps within the IF circuits in order to best align the receiver signals to the ADC dynamic range. It is particularly useful under high wanted signal conditions, to prevent overload. This is performed by an algorithm in the baseband DSP that continuously monitors the receiver signal level. A simple way is to switch the values of resistance that converts the mixer output into the current driving the ADC. A drawback in this approach is that the impedance level contributes to the ADC noise floor and to the pre-filter cut-off frequency. Hence this creates difficult compromises between the range of gain steps and the other electrical behaviours.

An object of the present invention is to avoid the above-mentioned drawback of switching between resistances when switching between gain steps within IF circuits.

According to a first aspect of the present invention there is provided a radio receiver including analogue-to-digital conversion means, a frequency dividing means for providing a sampling clock frequency for the analogue-to-digital conversion means, means for determining the strength of an output signal from the analogue-to-digital conversion means and means to alter a frequency dividing ratio of the frequency dividing means in response the determined strength of the said output signal in order to vary the gain of the analogue-to-digital conversion means.

An embodiment of a radio receiver made in accordance with the present invention comprises an input for a modulated radio frequency signal, frequency down conversion means coupled to the input, the frequency down conversion means including mixing means for demodulating a received modulated radio frequency signal using a local oscillator signal, analogue-to-digital conversion means coupled to receive a demodulated signal from the mixing means, the analogue-to-digital conversion means having an input for a sampling clock frequency, a voltage controlled oscillator, means coupled to the voltage controlled oscillator for providing the local oscillator signal, and frequency dividing means coupled to the voltage controlled oscillator for providing the sampling clock frequency, characterised by digital-to-frequency conversion means for providing a sampling clock frequency control signal according to the strength of a digital output signal from the analogue-to-digital conversion means, and in that the frequency dividing means is responsive to the sampling frequency control signal to vary a frequency dividing ratio of the dividing means.

According to a second aspect of the present invention there is provided a method of operating a radio receiver, the method comprising demodulating a received radio signal, filtering the demodulated signals and digitising the filtered signals in analogue-to-digital conversion means, characterised by altering the gain of the analogue-to-digital conversion means by varying the sampling clock frequency of the analogue-to-digital conversion means in accordance with the strength of a signal derived from the analogue-to-digital conversion means.

The present invention is based on the realisation that the gain of a digital-to-analogue converter (DAC) in the feedback loop of an ADC, especially a sigma delta ADC ($\Sigma\Delta$ ADC), is linearly dependent on the sampling clock frequency applied to the quantiser and the DAC. Hence automatic gain control (AGC) can be implemented without the drawback of changing the filter transfer characteristic or the ADC noise floor. Additionally this technique can be used to fine tune and/or calibrate the overall receiver gain.

Figure 2:
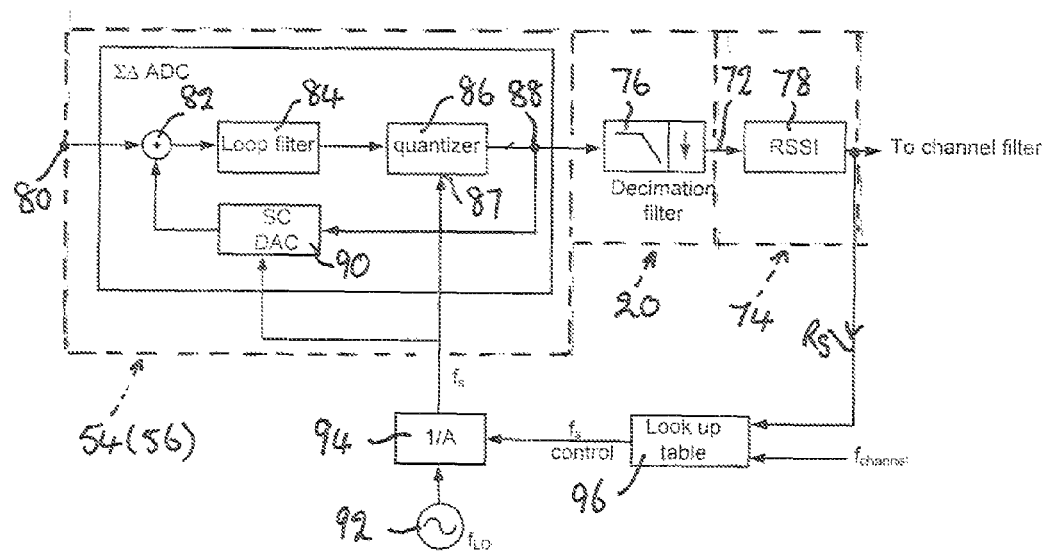
Figure 3:
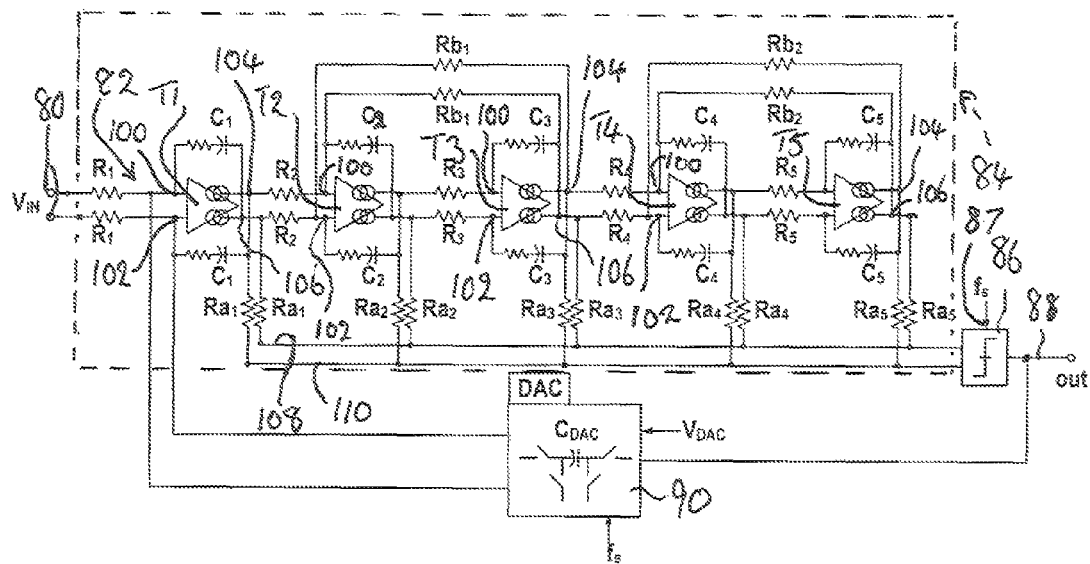

The present invention will now be described, by way of example, with reference to the accompany drawings, in which:

FIG. 1 is a block schematic diagram of a radio receiver made in accordance with the present invention, FIG. 2 is a block schematic diagram of a Sigma-Delta ADC ($\Sigma\Delta$ ADC) built with a switched capacitor DAC, and FIG. 3 is a schematic diagram of a $5^{th}$ order continuous time $\Sigma\Delta$ ADC with a switched capacitor DAC.

In the drawings the same reference numerals have been used to indicate corresponding features.

Referring to FIG. 1, a single antenna 12 is coupled to an input 14 of a radio receiver 10 supporting a limited frequency band but capable of operating across different modulation signal types. The radio receiver may be implemented as an integrated receiver or comprise a receiver section of an integrated transceiver. The receiver 10 comprises several functional blocks: a radio frequency (RF) front end 16, a receiver intermediate frequency (IF) conversion stage 18, a digital filter and decimation stage 20, and a RF frequency synthesiser formed by a RF frequency generator stage 22, a frequency divider and phase detection stage 24 and a crystal reference oscillator stage 26.

The RF front end stage 16 comprises an antenna pre-filter 28 having an input coupled to the input 14 and an output coupled to an input of a low noise amplifier (LNA) 30. An output of the LNA 30 is split into quadrature related I and Q paths having first and second mixers 32, 34, respectively, driven by quadrature local oscillator (LO) signals on first and second LO signal paths 33, 35. The RF front end stage 16 may be operated as a zero IF stage in which case the LO frequency corresponds to the carrier frequency which is converted to DC or as a low IF stage in which case the LO frequency is offset from the carrier frequency so that the wanted signal is frequency offset from DC. In the illustrated architecture digital signal processing is performed after ADC conversion in the digital filter and decimation stage 20. The supported frequency bands are mostly determined by the characteristics of the pre-filter 28, which characteristics are optimised to support the allocated spectrum per system.

In the illustrated embodiment the RF frequency generation stage 22 comprises a VCO 38 built from an amplifier and LC resonator tuning a voltage dependent capacitor which produces the RF frequency with an appropriate spectral purity. However in other applications such as UWB and DVB-S (Digital Video Broadcasting-Satellite) a ring oscillator may be used in place of the amplifier and LC resonator. The output of the VCO 38 is supplied by way of a buffer stage 40 and is used to clock a divide-by-2 circuit 42 providing quadrature LO signals at half the VCO frequency respectively to the first and second local oscillator paths 33, 35. First and second buffer amplifiers 43, 44 are provided in the first and second local oscillator paths 33, 35, respectively, to adjust the frequency divider outputs to give appropriate signal drive levels at the first and second mixers 32, 34. The VCO frequency is set within a RF frequency synthesiser loop which in the illustrated embodiment comprises a fractional-N PLL loop. However in other embodiments the frequency synthesiser could be an integer-N PLL or be built on a dual loop concept with an offset PLL that enables a fast locking time (UWB case) or an on-demand frequency planning generator.

The receiver IF conversion stage 18 comprises first and second filters 46, 48 for selecting the wanted products of mixing from the first and second mixers, respectively. In the case of the receiver being a zero-IF receiver the first and second filters 46, 48 will be implemented as low pass filters and in the case of the receiver being a low IF receiver, the first and second filters 46, 48 will be implemented either as high pass filters or band pass filters. First and second variable gain amplifiers 50, 52 are provided for pre-processing the signals from the first and second filters 46, 48, respectively. These signals are applied respectively, to first and second ADCs 54, 56. In operation the respective signals from the first and second mixers are characterised by a very wide dynamic range, due to the combination of many frequencies, not only the wanted signals and adjacent channels within the same system, but also all manner of interferers and potential blockers captured by the antenna 12 and pre-filtered. These wanted and unwanted signals have a wide variety of power levels and frequency offsets. At this point some simple filtering in the first and second filters 46, 48 and gain adjustment in the first and second amplifiers 50, 52 allows the dynamic range to be reduced to a more moderate level, if necessary. Nominally identical circuits process the I and Q signal path signals.

The first and second ADCs 54, 56 may be implemented as continuous time ΣΔ ADCs which have inherent anti-aliasing properties, which properties enable the filtering in the first and second filters 46, 48 to be less rigorous. The sampling clock frequency $f_s$ for the first and second ADCs 54, 56 is applied to inputs 55, 57 by the fractional-N frequency synthesiser, more particularly by a fractional divider 60 which receives the VCO frequency by way of the buffer 40. The fractional divider's output is also supplied to one input of a phase detector 62. An output of a crystal controlled oscillator 64 is supplied to a second input of the phase detector 60, an output of which is applied to a loop filter 68 which integrates the differences in phase and applies a correction signal to an input 70 of the VCO. The operation of a fractional-N frequency synthesiser is generally known in the art and accordingly it will not be described in detail. However it should be noted that all the frequencies required by the receiver 10 are produced from a single VCO 22 rather than from separate dedicated oscillators.

Reverting to the first and second ADCs, the analogue IF signal is converted to digital bits within the ADCs 54, 56. The most efficient implementation that readily supports multiple signal types is the continuous time sigma-delta analogue-to-digital converter (ΣΔ ADC). Such a type of converter lends itself readily to integration within fine lithography digital CMOS process which allows co-integration of the radio circuits with the baseband processor.

Simply providing the higher clock frequency increases the ADC's dynamic range, and thence reduces the analogue IF circuit complexity and size. These are advantageously replaced by digital filters which are both smaller and offer more predictable behaviour. The action of the ΣΔ ADC is to exchange amplitude for time domain information. The higher the signal dynamic range required, the higher the timing precision needed of the ADC clock.

Many receiver circuits currently employ the clock signals directly produced by the reference crystal oscillator, in the range of 10 to 30 MHz. Intrinsically, excellent spectral purity and low phase noise is guaranteed by its high Q resonator.

The digital filter and decimation stage 20 receives the digital bit streams from the first and second ADCs 54, 56 and by using successive stages of filtering and decimation enable extraction of a wanted signal from the surrounding frequencies from an output terminal 72. The wanted signal is in a form that can be used by a digital front end (DFE) 74 to execute IQ compensation, such as DC compensation, digital AGC and RSSI. In practice the output of the DFE 74 will be coupled to a digital demodulator (not shown) which performs channel equalisation and demodulation.

The preferred ADC implementation that enables the highest performance at lowest cost, used time continuous filtering in the forward path. However to reduce clock jitter, the DAC in the ΣΔ ADC is implemented using switched capacitance. The DAC gain is therefore linearly dependent on the clock frequency. In the receiver, this small gain variation as a function of channel frequency is not critical and can be tolerated since absolute signal gain is not well-controlled.

However it is often useful to implement a few simple gain steps within the IF circuits, to best align the receiver signals to the ADC dynamic range. It is particularly useful under high wanted signal conditions, to prevent overload. This is performed by an algorithm in the baseband DFE 74 that continuously monitors the receiver signal level. As mentioned in the preamble a simple way would be to switch the values of the resistance that converts the mixer output into the current driving the ADC but this has the drawbacks mentioned. In the receiver made in accordance with the present invention the ADC clock is changed in discrete steps, defined by the divider ratio, which allows the relative DAC gain to be set within the ADC feedback loop. Hence this allows the additional freedom in implementing AGC without the drawback of changing the filter transfer function or the ADC noise floor. It can also be used to fine tune or calibrate the overall receiver gain.

FIG. 2 illustrates the time continuous ΣΔ ADC 54 (56) coupled to the digital filter and decimation stage 20 which in turn is coupled to a channel filter part of the DFE 74. The DFE 74 also provides other functions including IQ compensation, such as DC compensation, digital AGC and RSSI. As ΣΔ ADCs are over sampled ADCs it is necessary to reduce the bit stream rate at the ADC output. This is done by decimation. When decimating you do not desire the alias fold-down in your wanted band of interest and therefore you first filter and decimate. The decimation filter partly removes some adjacent channel interferers (ACIs) but not completely. The channel filter removes the ACIs. In so far as understanding the present invention is concerned the stage 20 is shown as a decimation filter 76 and the DFE 74 is shown as a Received Signal Strength Indicator (RSSI) stage 78.

The time continuous ΣΔ ADC 54 (56) has the usual architecture comprising an input 80 coupled by way of a summing stage 82 to the input of a loop filter 84 which acts as an anti-aliasing filter providing a typical alias rejection of 80 dB. An output of the loop filter 84 is coupled to a quantiser 86 having an input 87 for a sampling clock frequency $f_s$ provided by dividing a local oscillator signal generator 92 using a divider 94 having a presettable divisor. An output 88 for a digitised signal is coupled to the decimation filter 76 and, by a feedback loop, to a switched capacitance digital-to-analogue (SC-DAC) 90 which provides an analogue output to the summing stage 82. The SC-DAC 90 also receives the sampling clock frequency $f_s$.

In order to be able to vary the frequency of the sampling clock frequency fs in discrete steps a look-up table 96 having inputs for a digital RSSI signal $R_s$ from the RSSI stage 78 and the channel frequency $f_{channel}$ is provided. A sampling clock frequency control signal read-out from the look-up table 96 is used to set the division ratio 1/A of the divider 94.

The divider 94 may comprise the divider 60 (FIG. 1) but in order to have complete flexibility it is preferred that it should be separate from the divider 60.

In operation an analogue signal at the input 80 is combined with an analogue signal supplied by the SC-DAC 90 and the result is applied to the loop filter 84 which eliminates low frequency noise. The quantiser 86 digitises the signal derived from the loop filter 84 and applies it to the decimation filter 76 and to the SC-DAC 90. The strength of the signal derived from the decimation filter 76 is measured by the RSSI stage 78 and the result $R_s$ is supplied to the look-up table 96. The sampling control signal is used vary appropriately the division ratio 1/A of the divider 94 to adjust the sampling clock frequency $f_s$ and thereby the gain of the time continuous ΣΔ ADC.

FIG. 3 illustrates a 5$^{th}$ order continuous time ΣΔ ADC having a SC-DAC in greater detail. The various parts corresponding to those shown in FIG. 2 in block form have the same reference numerals and in the interests of brevity will not be described again.

The loop filter 84 comprises five filter stages based on transconductors T1 to T5, each of the filter stages having the same basic architecture. In the interests of brevity the first stage will be described in detail together with other circuit connections between the second and third stages and the fourth and fifth stages. The subscripts applied to the various resistors and capacitors identify the filter stage with which they are associated.

The transconductor of the first stage has differential inputs 100, 102 and differential outputs 104, 106. Input resistors $R_1$ are coupled to the differential inputs 100, 102. The differential outputs 104, 106 are (a) cross connected by capacitors $C_1$ to the differential inputs 102, 100, (b) connected to resistors $R_2$ of the next following stage and (c) connected by resistors $Ra_1$ to lines 108, 110 coupled to respective inputs of the quantiser 86.

In addition the differential outputs 104, 106 of the transconductors T3 and T5 of the third and fifth stages are cross connected by means of respective resistors $Rb_1$ and $Rb_2$ to the differential inputs 102 and 100 of the transconductors T2 and T4 of the second and fourth stages, respectively. This enables the quantisation noise in the band of interest to be minimised. For the illustrated topology, the sampling clock $f_s$ expression is:

$$f_s = \frac{V_{in.rms}}{R_1 V_{dac} C_{dac}}$$

where Vin.rms max is the maximum magnitude of the signal at the input of the ADC. This signal is detected in the digital domain using the received strength indicator RSSI. When $V_{in.rms}$, is below (above) a low (high) limit value then the divider ratio A is increased (decreased). As a result, the sampling clock frequency $f_s$ is decreased (increased). By setting the DAC gain in the ADC it is possible to implement AGC without the drawback of changing the filter transfer function in front of the ADC or the overall the noise floor of the receiver. It can also be used to fine tune and/or calibrate the overall receiver gain. The typical alias rejection for the topology of the loop filter 84 is 80 dB.

Although the present invention has been described with reference to a radio receiver it is within the scope of the present invention that the radio receiver is a receiver section of a transceiver.

In the present specification and claims the word "a" or "an" preceding an element does not exclude the presence of a plurality of such elements. Further, the word "comprising" does not exclude the presence of other elements or steps than those listed.

The use of any reference signs placed between parentheses in the claims shall not be construed as limiting the scope of the claims.

From reading the present disclosure, other modifications will be apparent to persons skilled in the art. Such modifications may involve other features which are already known in the design, manufacture and use of radio receivers and component parts therefor and which may be used instead of or in addition to features already described herein.

The invention claimed is:

1. A radio receiver comprising:
an analogue-to-digital converter;
a frequency divider for providing a sampling clock frequency ($f_s$) for the analogue-to-digital converter for determining the strength of an output signal from the analogue-to-digital converter; and
a device for altering a frequency dividing ratio of the frequency divider in response to the determined strength of the said output signal in order to vary the gain of the analogue-to-digital converter.

2. A radio receiver as claimed in claim 1, characterised in that the frequency dividing ratio is varied in steps.

3. A radio receiver as claimed in claim 1, characterised in that the analogue-to-digital converter comprises a continuous time sigma-delta analogue-to-digital converter.

4. An integrated receiver comprising a radio receiver as claimed in claim 1.

5. An integrated transceiver comprising a transmitting section and a receiving section, characterised in that the receiving section comprises a radio receiver as claimed in claim 1.

6. A radio receiver comprising:
an input for a modulated radio frequency signal;
a frequency down converter coupled to the input, the frequency down converter including a mixer for demodulating a received modulated radio frequency signal using a local oscillator signal;
an analogue-to-digital converter coupled to receive a demodulated signal from the mixer, the analogue-to-digital converter having an input for a sampling clock frequency ($f_s$);

a voltage controlled oscillator coupled to the frequency down converter for providing the local oscillator signal; and a frequency divider coupled to the voltage controlled oscillator for providing the sampling clock frequency, wherein a digital-to-frequency converter provides a sampling clock frequency control signal ($f_{s\,control}$) according to a strength of a digital output signal from the analogue-to-digital converter, and in that the frequency divider is responsive to the sampling frequency control signal to vary a frequency dividing ratio (1/A) of the frequency divider.

7. A radio receiver as claimed in claim 6, characterised in that the analogue-to-signal converter comprises a continuous time sigma-delta analogue to digital converter having an input, a signal summer for summing an input signal and a feedback signal, a loop filter for filtering an output of the summer, a quantiser having an input coupled to the loop filter and an output, and a feedback path between the quantiser output and the summer, the feedback path including a digital-to-analogue converter, and in that the quantiser and the digital-to-analogue converter have inputs for receiving the sampling clock frequency ($f_s$).

8. A radio receiver as claimed in claim 7, characterised in that the digital-to-analogue converter comprises a switched capacitor digital-to-analogue converter.

9. A radio receiver as claimed in claim 7, characterised in that a received signal strength indicating stage is coupled to the output of the quantiser for producing digitised signal strength signals, and in that the digital-to-frequency conversion means comprises a look-up table storing sampling frequency control values to vary the dividing ratio of the frequency divider in response to the digitised signal strength control signals obtained from the received signal strength indicating stage.

10. A method of operating a radio receiver, the method comprising:

demodulating a received radio signal to obtain demodulated signals;

filtering the demodulated signals; and digitising the filtered signals in analogue-to-digital converter; and altering a gain of the analogue-to-digital converter by varying a sampling clock frequency ($f_s$) of the analogue-to-digital converter in accordance with a strength of a signal derived from the analogue-to-digital converter.

* * * * *